United States Patent
Tarui

(10) Patent No.: US 8,987,817 B2
(45) Date of Patent: Mar. 24, 2015

(54) SEMICONDUCTOR DEVICE HAVING A GATE INSULATING FILM WITH A THICKER PORTION COVERING A SURFACE OF AN EPITAXIAL PROTRUSION AND MANUFACTURING METHOD THEREOF

(75) Inventor: Yoichiro Tarui, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 55 days.

(21) Appl. No.: 13/197,237

(22) Filed: Aug. 3, 2011

(65) Prior Publication Data
US 2012/0112266 A1   May 10, 2012

(30) Foreign Application Priority Data
Nov. 10, 2010   (JP) .................. 2010-251725

(51) Int. Cl.
*H01L 29/66*   (2006.01)
*H01L 29/78*   (2006.01)
(Continued)

(52) U.S. Cl.
CPC .......... *H01L 29/7802* (2013.01); *H01L 23/544* (2013.01); *H01L 29/0657* (2013.01); *H01L 29/41766* (2013.01); *H01L 29/42368* (2013.01); *H01L 29/66068* (2013.01); *H01L 29/0878* (2013.01); *H01L 29/1608* (2013.01);
(Continued)

(58) Field of Classification Search
CPC ..................... H01L 29/7802; H01L 29/66068; H01L 29/31766; H01L 29/0657; H01L 29/42368; H01L 29/0878; H01L 29/1608; H01L 29/167; H01L 23/544; H01L 2223/54453; H01L 2223/54426

USPC .................................................. 257/287, 329
See application file for complete search history.

(56) References Cited

U.S. PATENT DOCUMENTS 5,814,859 A * 9/1998 Ghezzo et al. ................ 257/335
5,907,169 A * 5/1999 Hshieh et al. ................. 257/262
(Continued)

FOREIGN PATENT DOCUMENTS

CN   100544026 C   9/2009
JP   2002-280554   9/2002
(Continued)

OTHER PUBLICATIONS

Office Action issued Feb. 18, 2013, in Korean Patent Application No. 10-2011-0115591 with English translation.
(Continued)

*Primary Examiner* — Peter Bradford
(74) *Attorney, Agent, or Firm* — Oblon, Spivak, McClelland, Maier & Neustadt, L.L.P.

(57) ABSTRACT

A semiconductor device of the present invention includes: a semiconductor substrate of a first conductive type; an epitaxial layer of the first conductive type formed on the semiconductor substrate and having a protrusion formed on a surface thereof; a well region of a second conductive type formed on the surface of the epitaxial layer at each side of the protrusion; a source region of the first conductive type selectively formed in a surface of the well region; a gate insulating film formed so as to cover at least the protrusion and the surface of the well region; and a gate electrode formed on a part of the gate insulating film corresponding to the protrusion. The gate insulating film is thicker in a region thereof corresponding to an upper surface of the protrusion than the other regions thereof.

8 Claims, 10 Drawing Sheets

(51) Int. Cl.
*H01L 23/544* (2006.01)
*H01L 29/06* (2006.01)
*H01L 29/417* (2006.01)
*H01L 29/423* (2006.01)
*H01L 29/08* (2006.01)
*H01L 29/16* (2006.01)
*H01L 29/167* (2006.01)

(52) U.S. Cl.
CPC ..... *H01L29/167* (2013.01); *H01L 2223/54426* (2013.01); *H01L 2223/54453* (2013.01)
USPC .......................... 257/340; 257/287; 257/329

(56) References Cited

U.S. PATENT DOCUMENTS

| | | | |
|---|---|---|---|
| 6,096,607 A * | 8/2000 | Ueno | 438/268 |
| 7,452,763 B1 * | 11/2008 | Yu | 438/186 |
| 7,679,132 B2 | 3/2010 | Yoshie | |
| 2003/0057478 A1 * | 3/2003 | Yun et al. | 257/328 |
| 2004/0119076 A1 * | 6/2004 | Ryu | 257/77 |
| 2005/0181536 A1 * | 8/2005 | Tsuji | 438/105 |
| 2006/0024928 A1 * | 2/2006 | Seebauer et al. | 438/514 |
| 2006/0086990 A1 * | 4/2006 | Misaki et al. | 257/371 |
| 2007/0120194 A1 * | 5/2007 | Shiraishi et al. | 257/368 |
| 2008/0001158 A1 * | 1/2008 | Das et al. | 257/77 |
| 2010/0136760 A1 | 6/2010 | Yoshie | |
| 2010/0314629 A1 * | 12/2010 | Tarui et al. | 257/77 |

FOREIGN PATENT DOCUMENTS

| | | | |
|---|---|---|---|
| JP | 2003-124463 A | | 4/2003 |
| JP | 2005-191241 | * | 7/2005 |
| JP | 4049095 | | 12/2007 |
| JP | 2008-227172 | | 9/2008 |
| JP | 2009-32919 | | 2/2009 |
| WO | WO 2009/050871 A1 | | 4/2009 |

OTHER PUBLICATIONS

Office Action issued in Korean Application No. 10-2011-0115591 on Oct. 2, 2013 with partial English translation.

Japanese Office Action issued Apr. 1, 2014, in Japan Patent Application No. 2010-251725 (with English translation).

Combined Chinese Office Action and Search Report issued Dec. 13, 2013 in Patent Application No. 201110252431.3 (with English language translation).

Chinese Office Action issued Aug. 4, 2014, in China Patent Application No. 201110252431.3 (with English translation).

* cited by examiner

F I G. 6
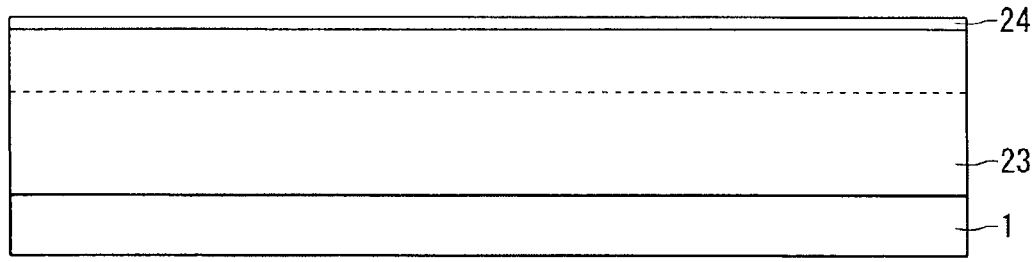
F I G. 7
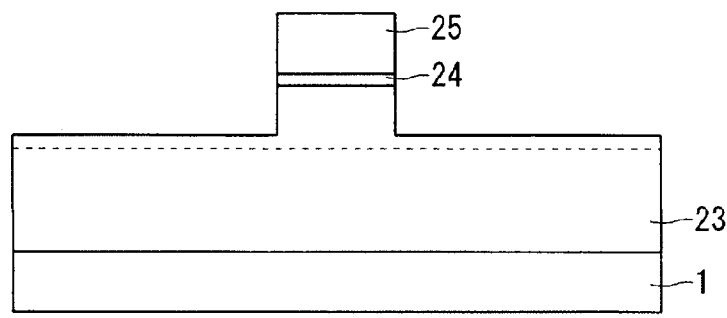
F I G. 8
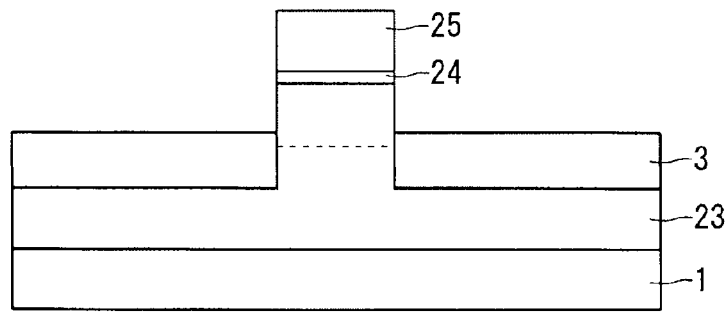

F I G . 1 7
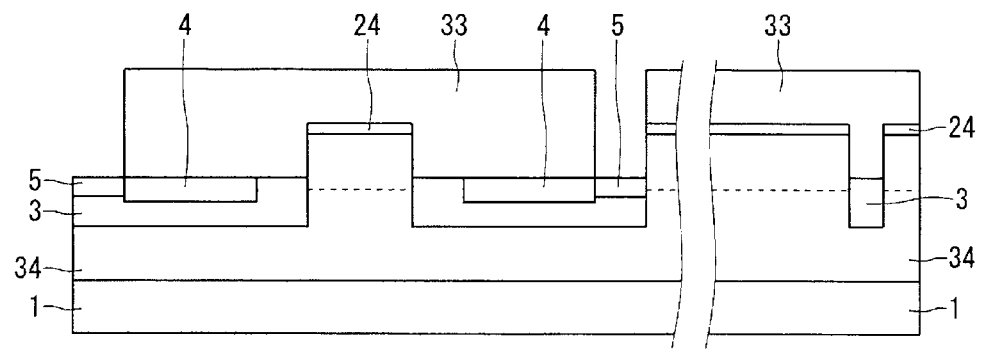
F I G . 1 8
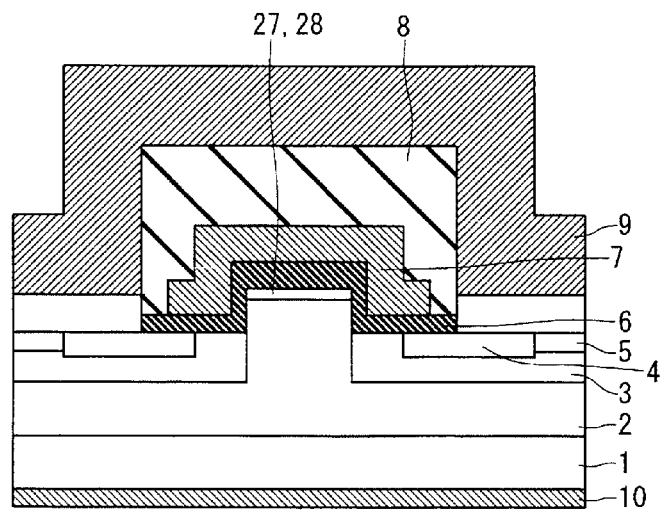

US 8,987,817 B2

SEMICONDUCTOR DEVICE HAVING A GATE INSULATING FILM WITH A THICKER PORTION COVERING A SURFACE OF AN EPITAXIAL PROTRUSION AND MANUFACTURING METHOD THEREOF

BACKGROUND OF THE INVENTION

1. Field of the Invention

The present invention relates to a semiconductor device and a method for manufacturing the semiconductor device, and particularly to a reduction in a field and in a gate capacitance of a gate insulating film in a JFET region of a MOSFET.

2. Description of the Background Art

According to Japanese Patent No. 4049095 disclosing a semiconductor device, a groove (protrusion) is formed on a surface of a drift region, and a p-well region is formed in a bottom portion of the groove. A gate insulating film is thicker at a side surface of the groove than at other portions.

In such a configuration, the gate insulating film in a JFET region is arranged on an upper side of the protrusion of the groove, to thereby suppress an electric field that is applied to the gate insulating film in the JFET region when a high voltage is applied to the drain side while a MOSFET is OFF.

According to Japanese Patent Application Laid-Open No. 2009-32919, in a planar MOSFET, a gate insulating film (oxide film) is thicker in a JFET region than in the other region so that an electric field applied to a JFET oxide film is suppressed.

The semiconductor devices disclosed in Japanese Patent No. 4049095 and Japanese Patent Application Laid-Open No. 2009-32919 involve a problem that the intensity of the electric field applied to the gate insulating film in the JFET region is not yet sufficiently suppressed, and also a problem that the gate capacitance increases to make a high-speed operation difficult.

SUMMARY OF THE INVENTION

An object of the present invention is to provide a semiconductor device capable of reducing the intensity of an electric field and suppressing a gate capacitance to a low value.

A semiconductor device of the present invention includes: a semiconductor substrate of a first conductive type; an epitaxial layer of the first conductive type formed on the semiconductor substrate and having a protrusion formed on a surface thereof; a well region of a second conductive type formed on the surface of the epitaxial layer at each side of the protrusion; a source region of the first conductive type selectively formed in a surface of the well region; a gate insulating film formed so as to cover at least the protrusion and the surface of the well region; and a gate electrode formed on a part of the gate insulating film corresponding to the protrusion. The gate insulating film is thicker in a region thereof corresponding to an upper surface of the protrusion than in the other regions thereof.

In the semiconductor device of the present invention, the gate insulating film 6 is thick in a JFET region. Thus, an electric field applied to the gate insulating film 6 when a MOSFET is off can be suppressed, and a gate capacitance can be reduced.

These and other objects, features, aspects and advantages of the present invention will become more apparent from the following detailed description of the present invention when taken in conjunction with the accompanying drawings.

BRIEF DESCRIPTION OF THE DRAWINGS

FIG. 6 shows a manufacturing step in manufacturing the semiconductor device according to the preferred embodiment 1;

FIG. 7 shows a manufacturing step in manufacturing the semiconductor device according to the preferred embodiment 1;

FIG. 8 shows a manufacturing step in manufacturing the semiconductor device according to the preferred embodiment 1;

FIG. 17 shows a manufacturing step in manufacturing the semiconductor device according to the preferred embodiment 1;

FIG. 18 shows a cross-section of the structure of a semiconductor device according to a preferred embodiment 2;

EMBODIMENT FOR CARRYING OUT THE INVENTION

<A. Preferred Embodiment 1>

Firstly, a background technique of a semiconductor device according to the present invention will be described.

Figure 25:
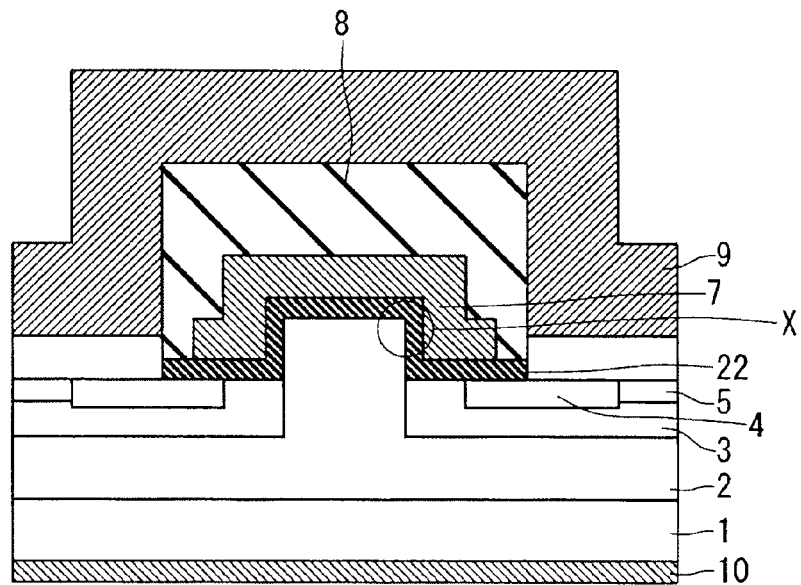
FIG. 25 shows a cross-section of the structure of a semiconductor device according to a background technique.

As shown in FIG. 25, in the semiconductor device according to the background technique of the present invention, an epitaxial layer 2 of a first conductive type (such as the N-type), which is a drift layer, is formed on a semiconductor substrate 1 of the first conductive type, and the epitaxial layer 2 has a protrusion interposed between grooves.

Well regions 3 of a second conductive type are formed on surfaces of the grooves of the epitaxial layer 2 such that the protrusion of the epitaxial layer 2 can be interposed between the well regions. Furthermore, a source region 4 of the first conductive type is selectively formed in a surface of the well region 3. A contact region 5 is formed on a surface of the epitaxial layer 2 so as to be adjacent to the source region 4.

As shown in FIG. 25, a gate insulating film 22 is formed so as to cover the surface of the epitaxial layer 2 including the protrusion, and a gate electrode 7 is arranged on the gate insulating film 22 so as to correspond to a region around the protrusion of the epitaxial layer 2.

A source electrode 9 is formed on the gate electrode 7 with an interlayer insulating film 8 interposed therebetween. A drain electrode 10 is formed on a surface of the semiconductor substrate 1 opposite to the surface where the epitaxial layer 2 is formed.

In such a structure, the gate insulating film 22 in a JFET region is arranged over an upper surface of the protrusion, and therefore when a high voltage is applied to the drain side while a MOSFET is OFF, an electric field applied to the gate insulating film 22 in the JFET region can be suppressed. However, in a region X of FIG. 25, the electric field is not sufficiently suppressed.

Figure 26:
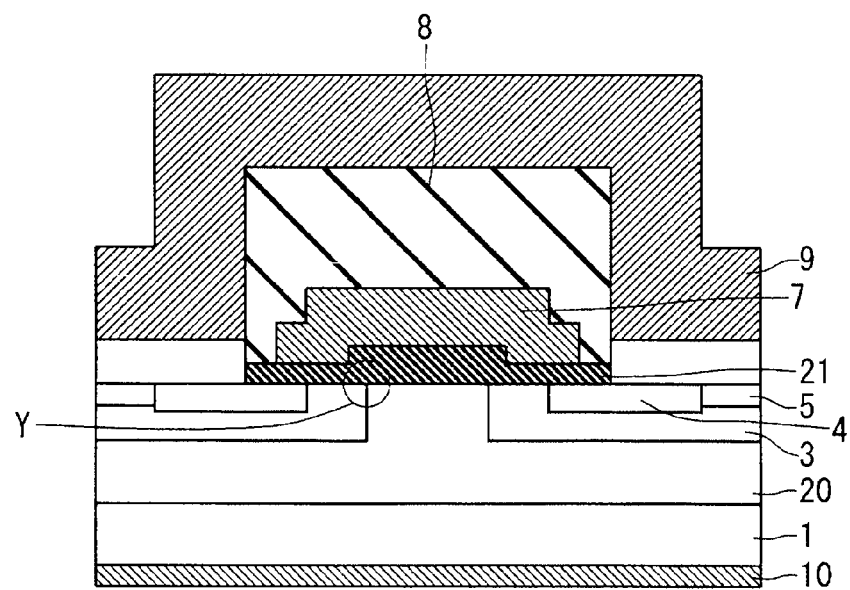
FIG. 26 shows a cross-section of the structure of a semiconductor device according to the background technique.

The structure of a semiconductor device shown in FIG. 26 is substantially identical to the structure the semiconductor device shown in FIG. 25, but different from that of FIG. 25 in that the epitaxial layer 20 has no protrusion. That is, the surface of the epitaxial layer 20 is at the same level as the surface where the well region 3 and the source region 4 are formed. Moreover, the semiconductor device of FIG. 26 is different from that of FIG. 25 in that the gate insulating film 21 is formed such that a portion thereof where the well region 3 and the source region 4 are not formed, that is, a portion thereof corresponding to a region immediately below the gate electrode 7, can be thicker than the other portions thereof.

In such a structure, the gate insulating film 21 is thicker in the JFET region than in the other regions, which can suppress an electric field applied to the gate insulating film 21 in the JFET region. However, in a region Y of FIG. 26, the electric field is not sufficiently suppressed.

In the following preferred embodiment, a detailed description will be given of a semiconductor device capable of solving the above-mentioned problem, reducing the intensity of the electric field, and suppressing the gate capacitance to a low value.

<A-1. Configuration>

Figure 1:
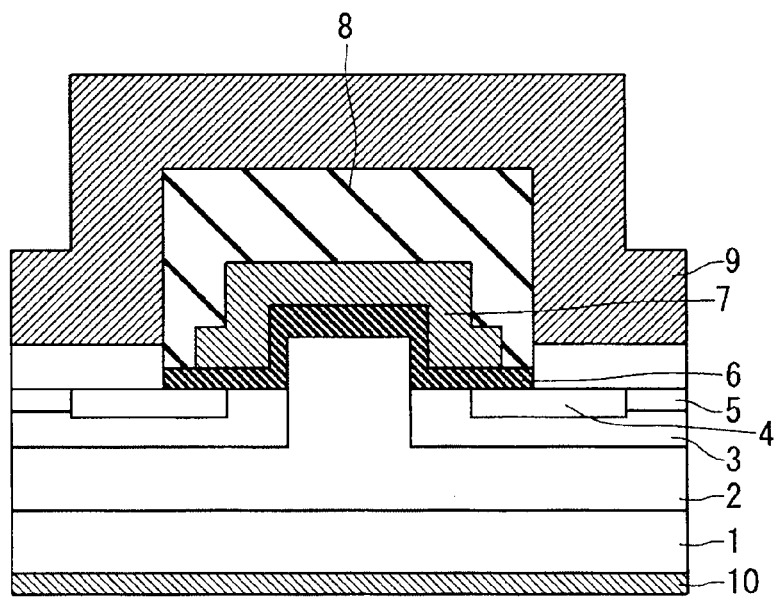
FIG. 1 shows a cross-section of the structure of a semiconductor device according to a preferred embodiment 1.

FIG. 1 shows a cross-section of the structure of a semiconductor device according to a preferred embodiment 1. It is desirable that a gate insulating film 6 is formed such that a portion thereof corresponding to an upper surface of a protrusion of an epitaxial layer 2 can be thicker than the other portion thereof.

As shown in FIG. 1, the epitaxial layer 2 has the protrusion. This increases a distance between an end portion of the well region 3 formed at each side across the protrusion and an end portion of the upper surface of the protrusion where a high electric field occurs, thus exerting an effect of reducing the electric field. Additionally, a portion of the epitaxial layer 2 in the JFET region forms the protrusion that protrudes upward. This consequently leads to a further reduction in the gate capacitance, to allow a high-speed operation.

Moreover, the thickness of the gate insulating film 6 can be made thicker at a side surface of the protrusion than in a region covering a surface of the well region 3. In this case, the electric field at the end portion of the upper surface of the protrusion can be further reduced, and the gate capacitance can also be further reduced.

Here, it is desirable that the depth of the protrusion is approximately 0.1 to 0.5 µm, and that the width of the protruding portion (width of the JFET region) is approximately 1 to 5 µm. In such a case, therefore, the area of the upper surface of the protrusion is larger than the area of the side surface of the protrusion. Thus, an increase in the thickness of the gate insulating film 6 on the upper surface more effectively exerts the reduction in the gate capacitance than an increase in the thickness of the gate insulating film 6 on the side surface.

Figure 2:
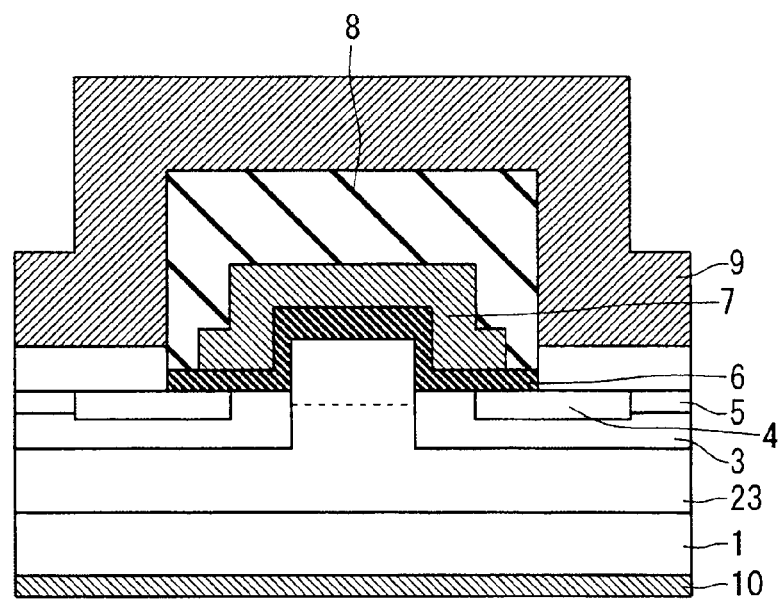
FIG. 2 shows a cross-section of the structure of the semiconductor device according to the preferred embodiment 1.
Figure 3:
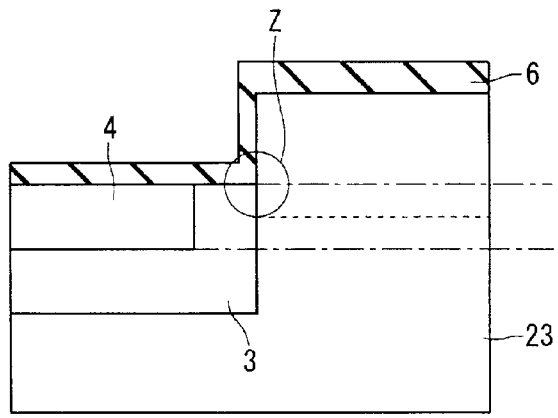
FIG. 3 shows a cross-section of the structure of the semiconductor device according to the preferred embodiment 1.

FIGS. 2 and 3 show cross-sections of the structure of the semiconductor device according to this preferred embodiment 1 as shown in FIG. 1, in a case where an epitaxial layer 23 having two-staged impurity concentrations is adopted. The other parts of the structure are identical to those shown in FIG. 1, and therefore detailed descriptions thereof are omitted. Similarly to the gate insulating film 6 of FIG. 1, the gate insulating film 6 of FIG. 2 is made thicker in the upper surface of the protrusion than in the other regions. However, the gate insulating film 6 of FIG. 2 may has a substantially constant thickness in the upper surface of the protrusion and in the other regions, similarly to the gate insulating film 22 of FIG. 25.

In the semiconductor device shown in FIGS. 2 and 3, the impurity concentration of the epitaxial layer 23 of the first conductive type is lower in an upper region of the protrusion than in a region below the upper region. A boundary of the low-concentration region is indicated by a dotted line in FIG. 2. As shown in detail in FIG. 3, the boundary is desirably defined at a position below a surface (indicated by the upper alternate long and short dash line) of the well region 3 and above a bottom face (the lower alternate long and short dash line) of the source region 4.

In this manner, the impurity concentration of the epitaxial layer 23 is lowered in the region above the boundary. This makes it easy that a depletion layer extends at the upper surface of the protrusion. Thus, an electric field applied to the gate insulating film 6 in the JFET region is suppressed.

Providing the boundary below the surface of the well region 3 can suppress an electric field applied to a region Z shown in FIG. 3, and providing the boundary above the bottom surface of the source region 4 can suppress an increase in a JFET resistance.

Figure 4:
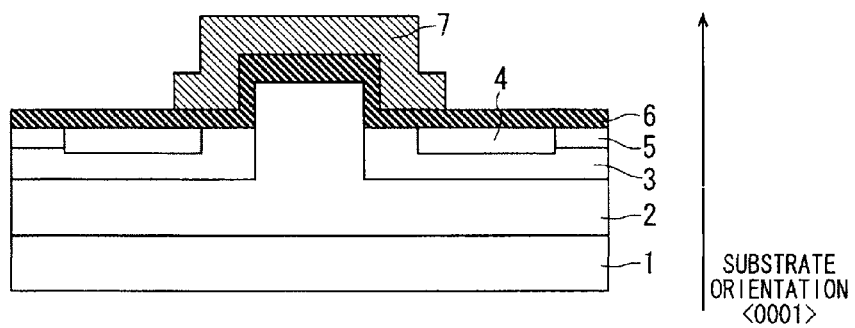
FIG. 4 shows a cross-section of the structure of the semiconductor device according to the preferred embodiment 1.

FIG. 4 shows a part of the structure of the semiconductor device according to this preferred embodiment 1.

For example, in a case where an SiC substrate is adopted as the semiconductor substrate and hexagonal SiC is used, a surface orientation of the substrate is set such that a surface of the epitaxial layer 2 at the side where the protrusion is not formed can be the (0001) Si surface, as shown in FIG. 4. As a result, when the gate insulating film 6 is formed by thermal oxidation, an oxide film is made larger at the side surface of the protrusion than in the region where the protrusion is not formed, due to the anisotropy in a thermal oxidation rate.

The surface orientation of the substrate may be inclined with respect to the (0001) Si surface by a few degrees. Normally, a commercially available substrate has an off angle of 4 to 8 degrees. This amount of inclination does not prevent the embodiment, because the anisotropy in the thermal oxidation rate between the region where the protrusion is not formed and the side surface of the protrusion can be sufficiently ensured. Due to the anisotropy in the thermal oxidation rate, the thickness of a thermal oxidation film at the side surface of the protrusion is larger than the thickness of a thermal oxidation film in the region where the protrusion is not formed, so that an electric field applied to the gate oxide film of the JFET region can be further suppressed and the gate capacitance can also be reduced.

Although the structure shown in FIG. 4 adopts the epitaxial layer 2, the epitaxial layer 23 may be adopted.

<A-2. Manufacturing Method>

FIGS. 5 to 12 show a method for manufacturing the semiconductor device according to this preferred embodiment 1. In the following, as an example of the semiconductor substrate, an SiC substrate is used as a wide band gap semiconductor.

Figure 5:
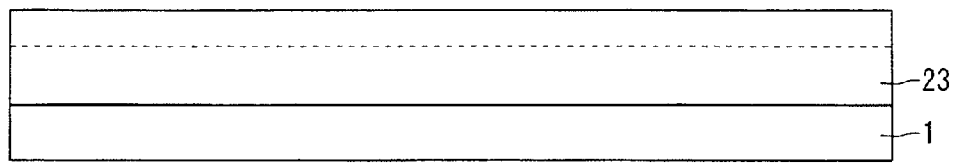
FIG. 5 shows a manufacturing step in manufacturing the semiconductor device according to the preferred embodiment 1.

The epitaxial layer 23, such as a layer obtained by epitaxial growth of n− type SiC, is formed on the semiconductor substrate 1 of the first conductive type, for example, on an n+ type SiC substrate (see FIG. 5). When the epitaxial growth progresses to a predetermined thickness, the impurity concentration is changed such that a region above the dotted line in FIG. 5 has a lower impurity concentration than a region below the dotted line.

Additionally, a high concentration ion-implanted layer 24 is formed on an upper surface of the epitaxial layer 23 (see FIG. 6). The high concentration ion-implanted layer 24 means a layer in which the volume density of implanted ion is equal to or higher than $1 \times 10^{20}$ cm$^{-3}$, and is characterized in that, for example, SiC in which ion is implanted is amorphized. It is necessary that the high concentration ion-implanted layer 24 is thicker than the gate insulating film 6 which will be described later. This allows an insulating film formed by accelerated oxidation which will be described later to be thicker than the gate insulating film 6 formed in the other regions.

Then, an etching process is performed using a mask 25, to form a protrusion on a surface of the epitaxial layer 23 in such a manner that the height of the protrusion can be larger than the thickness of the high concentration ion-implanted layer 24 (see FIG. 7) and that etching can be performed down to a depth smaller than the depth of the boundary at which the impurity concentration of the epitaxial layer 23 changes.

Using the same mask 25, the well region 3 of the second conductive type, such as a p-well region, is formed by ion implantation in a region where the protrusion of the epitaxial layer 23 is not formed (see FIG. 8). The well region 3 is formed such that the depth thereof can be larger than the depth of the boundary at which the impurity concentration of the epitaxial layer 23 changes.

Figure 9:
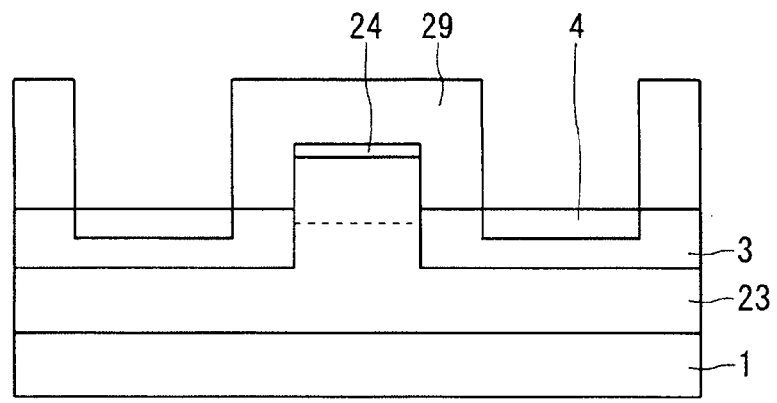
FIG. 9 shows a manufacturing step in manufacturing the semiconductor device according to the preferred embodiment 1.
Figure 10:
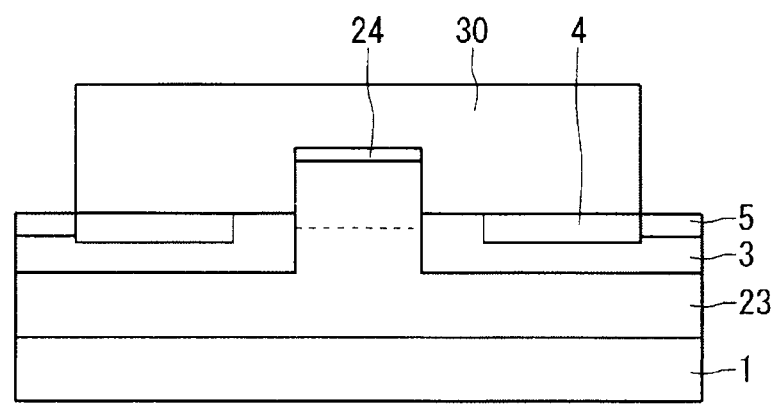
FIG. 10 shows a manufacturing step in manufacturing the semiconductor device according to the preferred embodiment 1.
Figure 11:
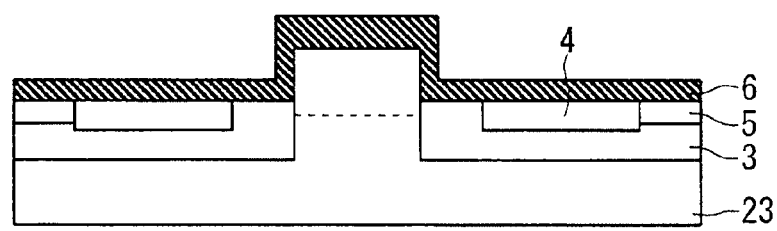
FIG. 11 shows a manufacturing step in manufacturing the semiconductor device according to the preferred embodiment 1.
Figure 12:
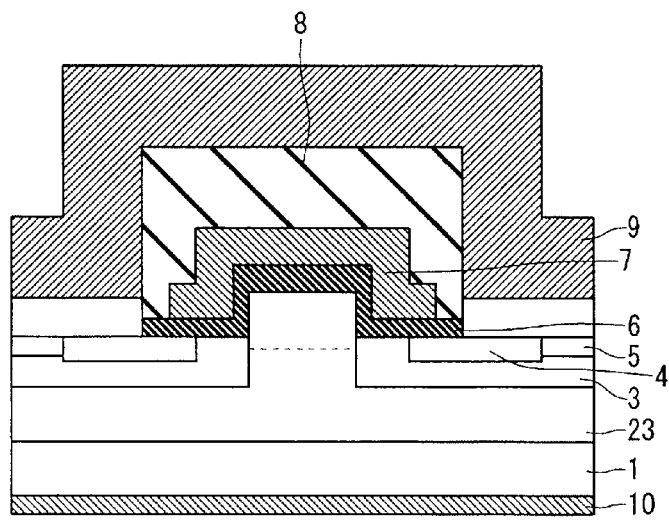
FIG. 12 shows a manufacturing step in manufacturing the semiconductor device according to the preferred embodiment 1.

The source region 4 is formed in the well region 3 by performing ion implantation using the mask 29 (see FIG. 9). Here, the source region 4 is formed such that the depth thereof can be larger than the depth of the boundary at which the impurity concentration of the epitaxial layer 23 changes.

Moreover, the contact region 5 is formed using a mask 30 (see FIG. 10), and a field reduction region at a terminal part (not shown) is formed. Then, an activation annealing process is performed to activate the ion-implanted regions of the well region 3, the source region 4, and the contact region 5. At this time, it is ensured that crystal defects in the high concentration ion-implanted layer 24 are not completely recovered.

When the gate insulating film 6 is formed by thermal oxidation so as to cover the epitaxial layer 23, the well region 3, the source region 4, and the contact region 5, the oxidation rate is increased on the upper surface of the protrusion as compared with other regions having no crystal defect (accelerated oxidation), because of the crystal defects left in the high concentration ion-implanted layer 24 existing on the upper surface of the protrusion. As a result, the gate insulating film 6 formed on the upper surface of the protrusion can be made thicker than the gate insulating film 6 in the regions where the protrusion is not formed (see FIG. 11).

After the gate insulating film 6 is formed, the gate electrode 7 of poly-Si or the like, the interlayer insulating film 8, the source electrode 9 of Ni, Al, or the like, and the drain electrode 10 of Ni or the like, are formed in the same manner as the general method for manufacturing a MOSFET. Thus, a desired semiconductor device is manufactured (see FIG. 12).

Although the epitaxial layer 23 is adopted in the manufacturing method shown in FIGS. 5 to 12, the epitaxial layer 2 may be adopted.

Increasing the thickness of the gate insulating film 6 formed on the upper surface of the protrusion can suppress an increase in the intensity of the electric field at corners of the upper surface of the protrusion. Additionally, increasing the thickness of the gate insulating film 6 can reduce the gate capacitance, to allow a high-speed operation.

Furthermore, if the thickness of the gate insulating film 6 on the side surface of the protrusion is also formed thicker than in the region where the protrusion is not formed, and thereby the electric field at the corners of the upper surface of the protrusion can be further reduced, and the gate capacitance can be also reduced. In FIGS. 5 to 12, the high concentration ion-implanted layer 24 is preferably formed by oxygen ion. In this case, oxygen enters SiC to improve the quality of the insulating film (thermal oxidation film) formed by the accelerated oxidation, so that the breakdown strength is increased. The high concentration ion-implanted layer 24 may be formed by nitrogen ion. If nitrogen enters SiC, the nitrogen is introduced into an interface during the thermal oxidation, so that the level of the interface can be lowered. Thus, the channel mobility of the MOSFET is improved, to reduce an on-resistance.

FIGS. 13 to 17 show a modification of the method for manufacturing the semiconductor device according to this preferred embodiment 1. A basic flow thereof is identical to that of the manufacturing method shown in FIGS. 5 to 12, and therefore steps different from the manufacturing method shown in FIGS. 5 to 12 will be described in detail.

Figure 13:
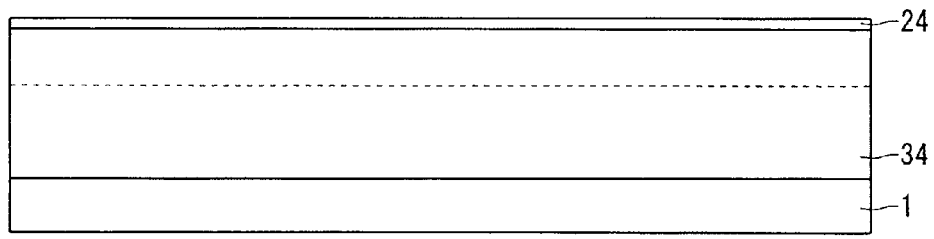
FIG. 13 shows a manufacturing step in manufacturing the semiconductor device according to the preferred embodiment 1.
Figure 14:
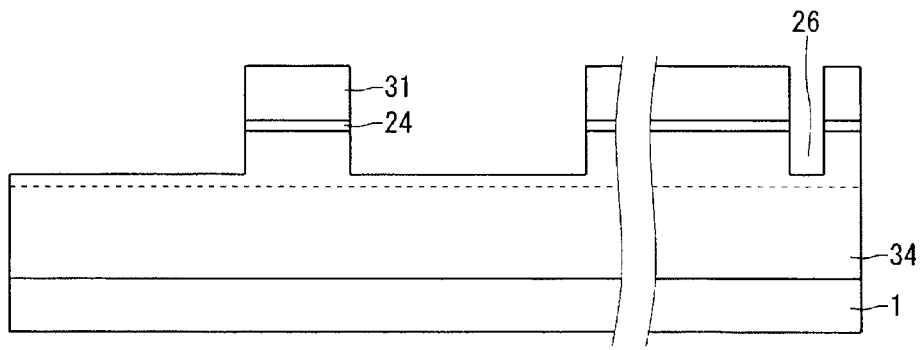
FIG. 14 shows a manufacturing step in manufacturing the semiconductor device according to the preferred embodiment 1.

An epitaxial layer 34, such as a layer obtained by epitaxial growth of n− type SiC, is formed on the semiconductor substrate 1 of the first conductive type, such as an n+ type SiC substrate (see FIG. 13). When the epitaxial growth progresses to a predetermined thickness, the impurity concentration is changed such that a region above the dotted line in FIG. 13 has a lower impurity concentration than a region below the dotted line. Additionally, the high concentration ion-implanted layer 24 is formed on an upper surface of the epitaxial layer 34.

Then, an etching process is performed using a mask 31, to form a protrusion on a surface of the epitaxial layer 34 in such a manner that the height of the protrusion can be larger than the thickness of the high concentration ion-implanted layer 24 (see FIG. 14) and that etching can be performed down to a depth smaller than the depth of the boundary at which the impurity concentration of the epitaxial layer 34 changes. Simultaneously, an alignment mark 26 is formed.

Figure 15:
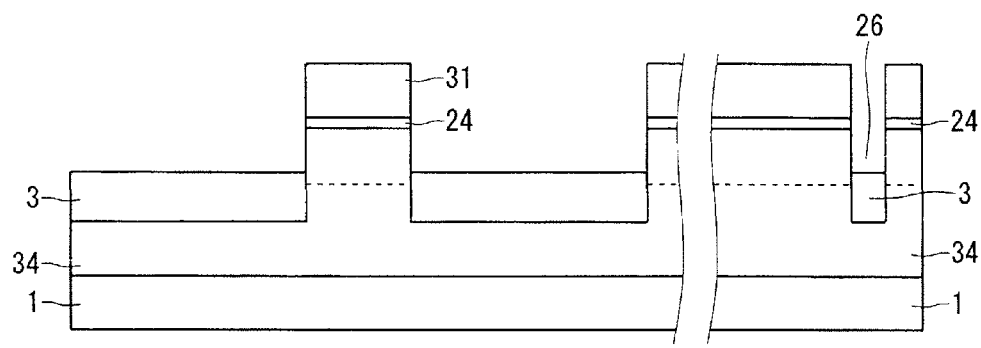
FIG. 15 shows a manufacturing step in manufacturing the semiconductor device according to the preferred embodiment 1.

Using the same mask 31, the well region 3 of the second conductive type, such as a p-well region, is formed by ion implantation in a region (groove region) where the protrusion of the epitaxial layer 34 is not formed (see FIG. 15). The well region 3 is formed such that the depth thereof can be larger than the depth of the boundary at which the impurity concentration of the epitaxial layer 34 changes.

Figure 16:
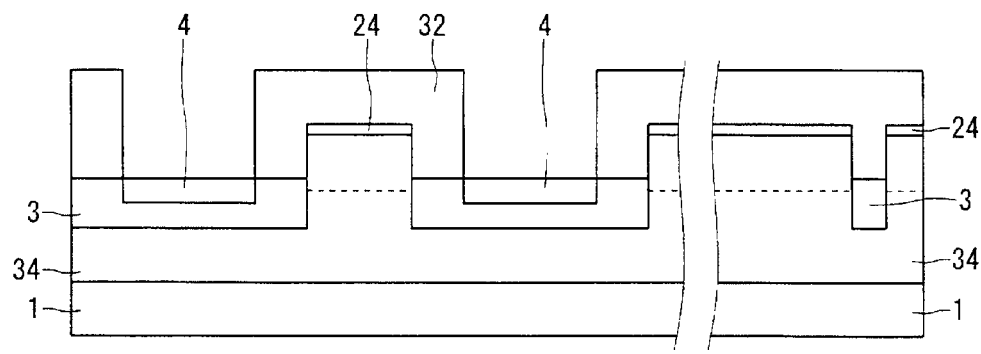
FIG. 16 shows a manufacturing step in manufacturing the semiconductor device according to the preferred embodiment 1.

The source region 4 is formed in the well region 3 by performing ion implantation using the mask 32 (see FIG. 16). Here, the source region 4 is formed such that the depth thereof can be larger than the depth of the boundary at which the impurity concentration of the epitaxial layer 34 changes.

Moreover, the contact region 5 is formed using a mask 33 (see FIG. 17), and a field reduction region at a terminal part (not shown) is formed. Then, an activation annealing process is performed to activate the ion-implanted regions of the well region 3, the source region 4, and the contact region 5.

Forming the semiconductor device in this manner not only can save a step for forming the alignment mark 26 but also can improve the accuracy of alignment between the well region 3 and the source region 4.

Although the epitaxial layer 34 is adopted in the manufacturing method shown in FIGS. 13 to 17, the epitaxial layer may have no difference in concentration.

<A-3. Effect>

The semiconductor device according to the preferred embodiment 1 of the present invention includes the semiconductor substrate 1 of the first conductive type, the epitaxial layer 23 of the first conductive type, the well region 3 of the second conductive type, the source region 4 of the first conductive type, the gate insulating film 6, and the gate electrode 7. The epitaxial layer 23 is formed on the semiconductor substrate 1 and has a protrusion formed on the surface thereof. The well region 3 is formed on the surface of the epitaxial layer 23 at each side of the protrusion. The source region 4 is selectively formed in the surface of the well region 3. The gate insulating film 6 is formed so as to cover at least the protrusion and the surface of the well region 3. The gate electrode 7 is formed on a part of the gate insulating film 6 corresponding to the protrusion. The gate insulating film 6 is thicker in the region corresponding to the upper surface of the protrusion than in the other regions, and therefore the gate insulating film 6 is thick in the JFET region, so that an electric field applied to the gate insulating film 6 when the MOSFET is off can be suppressed and the gate capacitance can be reduced.

In the semiconductor device according to the preferred embodiment 1 of the present invention, the upper region of the protrusion of the epitaxial layer 23 has a lower concentration than the lower region thereof. This makes it easy that the depletion layer in the JFET region extends. Thus, an electric field applied to the gate insulating film 6 in the JFET region is further suppressed, and the gate capacitance is reduced, too.

In the semiconductor device according to the preferred embodiment 1 of the present invention, the boundary between the upper region and the lower region of the protrusion is defined at a position below the surface of the well region 3 and above the bottom surface of the source region 4. This can suppress an electric field applied to the region Z. Since the upper region having the lower concentration is not formed very deeply, the amount of increase in the JFET resistance is small.

In the semiconductor device according to the preferred embodiment 1 of the present invention, the gate insulating film 6 is thicker in the region corresponding to the side surface of the protrusion than in the region covering the surface of the well region 3. This can further suppress an electric field applied to the gate insulating film 6 when the MOSFET is off, and reduce the gate capacitance.

The method for manufacturing the semiconductor device according to the preferred embodiment 1 of the present invention includes the steps of: (a) forming the epitaxial layer 23 of the first conductive type on the semiconductor substrate 1 of the first conductive type, the epitaxial layer 23 having the protrusion formed on the surface thereof; (b) forming the well region 3 of the second conductive type on the surface of the epitaxial layer 23 at each side of the protrusion; (c) selectively forming the source region 4 of the first conductive type in the surface of the well region 3; (d) forming the gate insulating film 6 so as to cover at least the protrusion and the surface of the well region 3; and (e) forming the gate electrode 7 on a part of the gate insulating film 6 corresponding to the protrusion. In the step (d), the gate insulating film 6 is formed such that the region thereof corresponding to the upper surface of the protrusion is thicker than the other regions thereof. Thereby, the thickness of the gate insulating film 6 in the JFET region is increased. This can suppress an electric field applied to the gate insulating film 6 when the MOSFET is off and reduce the gate capacitance.

<B. Preferred Embodiment 2>
<B-1. Configuration>

FIG. 18 shows a cross-section of a structure of a semiconductor device according to a preferred embodiment 2. This structure is identical to the structure shown in FIG. 1, except that a second conductive type region 27 or a semi-insulating region 28 is additionally formed between the upper surface of the protrusion and the gate insulating film 6.

This formation process makes it easy that the depletion layer in the JFET region extends, so that an electric field applied to the gate insulating film 6 in the JFET region can be further suppressed, and the gate capacitance can be reduced, too.

Although the epitaxial layer 2 is adopted in the example shown in FIG. 18, the epitaxial layer 23 may be used.

<B-2. Manufacturing Method>

Figure 19:
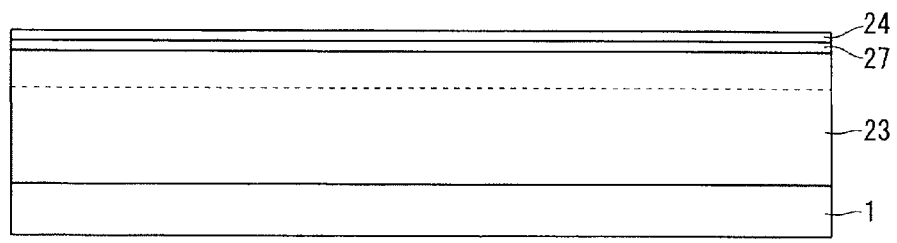
FIG. 19 shows a manufacturing step in manufacturing the semiconductor device according to the preferred embodiment 2.
Figure 20:
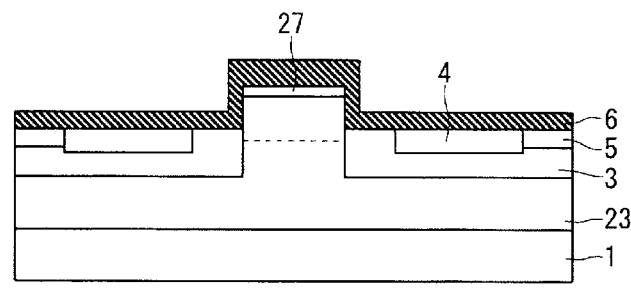
FIG. 20 shows a manufacturing step in manufacturing the semiconductor device according to the preferred embodiment 2.
Figure 21:
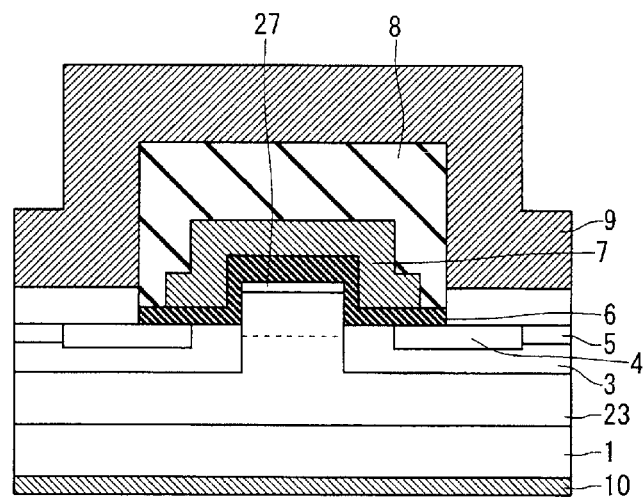
FIG. 21 shows a manufacturing step in manufacturing the semiconductor device according to the preferred embodiment 2.

FIGS. 19 to 21 show a first method for manufacturing the semiconductor device according to the preferred embodiment 2. A basic flow thereof is identical to that of the preferred embodiment 1 shown in FIGS. 5 to 12, and therefore steps different from the manufacturing method shown in FIGS. 5 to 12 will be described in detail.

The epitaxial layer 23, such as a layer obtained by epitaxial growth of n– type SiC, is formed on the semiconductor substrate 1 of the first conductive type, such as an n+ type SiC substrate. When the epitaxial growth progresses to a predetermined thickness, the impurity concentration is changed such that a region above the dotted line in FIG. 19 has a lower impurity concentration than a region below the dotted line.

Additionally, the high concentration ion-implanted layer 24 is formed on the upper surface of the epitaxial layer 34 (see FIG. 19). In forming the high concentration ion-implanted layer 24, the second conductive type region 27 is formed below the high concentration ion-implanted layer 24. Here, the same kind of ion may be used for implantation in the high concentration ion-implanted layer 24 and for forming the second conductive type region 27.

Then, an etching process is performed using a mask, to form a protrusion on the surface of the epitaxial layer 23 in such a manner that the height of the protrusion can be larger than the total thickness of the high concentration ion-implanted layer 24 and the second conductive type region 27 and that etching can be performed down to a depth smaller than the depth of the boundary at which the impurity concentration of the epitaxial layer 23 changes.

Using the same mask, the well region 3 of the second conductive type, such as a p-well region, is formed by ion implantation in a region where the protrusion of the epitaxial layer 23 is not formed. The well region 3 is formed such that the depth thereof can be larger than the depth of the boundary at which the impurity concentration of the epitaxial layer 23 changes.

The source region 4 is formed in the well region 3 by using ion implantation, up to a position deeper than the boundary at which the impurity concentration of the epitaxial layer 23 changes. Moreover, the contact region 5 is formed. A field reduction region at a terminal part (not shown) is formed, and then an activation annealing process is performed to activate the ion-implanted regions of the well region 3, the source region 4, and the contact region 5.

When the gate insulating film 6 is formed by thermal oxidation so as to cover the epitaxial layer 23, the well region 3, the source region 4, the contact region 5, and the second conductive type region 27, the oxidation rate is increased on the upper surface of the protrusion as compared with the other regions having no crystal defect (accelerated oxidation), because of the crystal defects left in the high concentration ion-implanted layer 24 existing on the upper surface of the protrusion. As a result, the gate insulating film 6 formed on the upper surface of the protrusion can be made thicker than the gate insulating film 6 in the regions where the protrusion is not formed (see FIG. 20).

Furthermore, the gate electrode 7 of poly-Si or the like, the interlayer insulating film 8, the source electrode 9 of Ni, Al, or the like, and the drain electrode 10 of Ni or the like, are formed in the same manner as the general method for manufacturing a MOSFET. Thus, a desired semiconductor device is manufactured (see FIG. 21). Al ion or B ion is preferably used as the ion implanted in the second conductive type region 27.

Although the epitaxial layer 23 is adopted in the example shown in FIG. 21, the epitaxial layer 2 may be also adopted.

This formation process makes it easy that the depletion layer in the JFET region extends, so that an electric field applied to the gate insulating film 6 in the JFET region can be further suppressed, and the gate capacitance can be also reduced.

Figure 22:
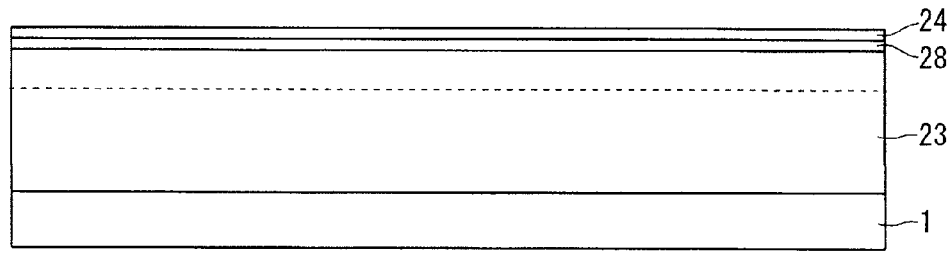
FIG. 22 shows a manufacturing step in manufacturing the semiconductor device according to the preferred embodiment 2.
Figure 23:
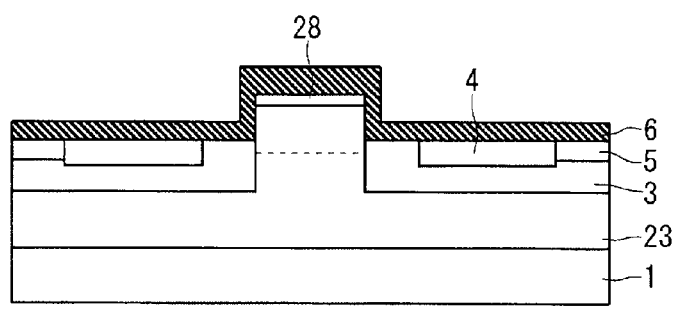
FIG. 23 shows a manufacturing step in manufacturing the semiconductor device according to the preferred embodiment 2.
Figure 24:
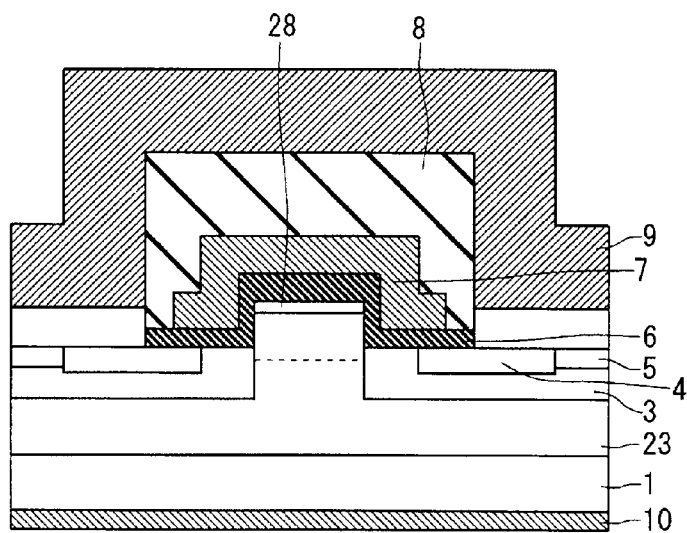
FIG. 24 shows a manufacturing step in manufacturing the semiconductor device according to the preferred embodiment 2.

FIGS. 22 to 24 show a second method for manufacturing the semiconductor device according to the preferred embodiment 2. A basic flow thereof is identical to that of the preferred embodiment 1 shown in FIGS. 5 to 12, and therefore steps different from the manufacturing method shown in FIGS. 5 to 12 will be described in detail The epitaxial layer 23, such as a layer obtained by epitaxial growth of n– type SiC, is formed on the semiconductor substrate 1 of the first conductive type, such as an n+ type SiC substrate. When the epitaxial growth progresses to a predetermined thickness, the impurity concentration is changed such that a region above the dotted line in FIG. 22 has a lower impurity concentration than a region below the dotted line. Additionally, the high concentration ion-implanted layer 24 is formed on the upper surface of the epitaxial layer 23 (see FIG. 22). In forming the high concentration ion-implanted layer 24, the semi-insulating region 28 is formed below the high concentration ion-implanted layer 24. Here, the same kind of ion may be used for implantation in the high concentration ion-implanted layer 24 and for forming the semi-insulating region 28.

Then, an etching process is performed using a mask, to form a protrusion on the surface of the epitaxial layer 23 in such a manner that the height of the protrusion can be larger than the total thickness of the high concentration ion-implanted layer 24 and the semi-insulating region 28 and that etching can be performed down to a depth smaller than the depth of the boundary at which the impurity concentration of the epitaxial layer 23 changes.

Using the same mask, the well region 3 of the second conductive type, such as a p-well region, is formed by ion implantation in a region where the protrusion of the epitaxial layer 23 is not formed. The well region 3 is formed such that the depth thereof can be larger than the depth of the boundary at which the impurity concentration of the epitaxial layer 23 changes.

The source region 4 is formed in the well region 3 by using ion implantation, up to a position deeper than the boundary at which the impurity concentration of the epitaxial layer 23 changes. Moreover, the contact region 5 is formed. A field reduction region at a terminal part (not shown) is formed, and then an activation annealing process is performed to activate the ion-implanted regions of the well region 3, the source region 4, and the contact region 5.

When the gate insulating film 6 is formed by thermal oxidation so as to cover the epitaxial layer 23, the well region 3, the source region 4, the contact region 5, and the semi-insulating region 28, the oxidation rate is increased on the upper surface of the protrusion as compared with other regions having no crystal defect (accelerated oxidation), because of the crystal defects left in the high concentration ion-implanted layer 24 existing on the upper surface of the protrusion. As a result, the gate insulating film 6 formed on the upper surface of the protrusion can be made thicker than the gate insulating film 6 in the regions where the protrusion is not formed (see FIG. 23).

Furthermore, the gate electrode 7 of poly-Si or the like, the interlayer insulating film 8, the source electrode 9 of Ni, Al, or the like, and the drain electrode 10 of Ni or the like, are formed in the same manner as the general method for manufacturing a MOSFET. Thus, a desired semiconductor device is manufactured (see FIG. 24). V ion is preferably used as the ion implanted in the semi-insulating region 28.

This formation process makes it easy that the depletion layer in the JFET region extends, so that an electric field applied to the gate insulating film 6 in the JFET region can be further suppressed, and the gate capacitance can be also reduced.

Although the epitaxial layer 23 is adopted in the example shown in FIG. 24, the epitaxial layer 2 may be also adopted.

<B-3. Effect>

In the semiconductor device according to the preferred embodiment 2 of the present invention, the second conductive type region 27 is additionally provided between the upper surface of the protrusion and the gate insulating film 6. This makes it easy that the depletion layer in the JFET region extends. Thus, an electric field applied to the gate insulating film 6 in the JFET region can be further suppressed, and the gate capacitance can be also reduced.

In the semiconductor device according to the preferred embodiment 2 of the present invention, the semi-insulating region 28 is additionally provided between the upper surface of the protrusion and the gate insulating film 6. This makes it easy that the depletion layer in the JFET region extends. Thus, an electric field applied to the gate insulating film 6 in the JFET region can be further suppressed, and the gate capacitance can be also reduced.

Although materials of the component parts, conditions for implementation, and the like, have been described in the preferred embodiments of the present invention, they are merely illustrative and not restrictive.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   a semiconductor substrate of a first conductive type;
   an epitaxial layer of the first conductive type formed on said semiconductor substrate and having a protrusion formed on a surface thereof;
   a well region of a second conductive type formed on the surface of said epitaxial layer at each side of said protrusion;
   a source region of the first conductive type selectively formed in a surface of said well region;
   a gate insulating film formed so as to cover at least said protrusion and the surface of said well region; and
   a gate electrode formed on a part of said gate insulating film corresponding to said protrusion,
   wherein said gate insulating film is thicker in a film formed in a region thereof corresponding to an upper surface of said protrusion, than in a film formed on said well region thereof,
   an upper region of said protrusion of said epitaxial layer has a lower impurity concentration than a lower region of said protrusion of said epitaxial layer, and
   a boundary between said upper region and said lower region of said protrusion extends from one side of said protrusion to the other side of said protrusion at a position below the surface of said well region and above a bottom surface of said source region.

2. The semiconductor device according to claim 1, wherein said gate insulating film is thicker in a film formed in a region thereof corresponding to a side surface of said protrusion than the film formed on said well region, the film being formed on the surface of said well region.

3. The semiconductor device according to claim 1, further comprising a second conductive type region provided between the upper surface of said protrusion and said gate insulating film.

4. The semiconductor device according to claim 1, further comprising a semi-insulating region provided between the upper surface of said protrusion and said gate insulating film.

5. The semiconductor device according to claim 1, wherein said semiconductor substrate is formed of a wide band gap semiconductor.

6. A method for manufacturing a semiconductor device, said method comprising the steps of:
   (a) forming an epitaxial layer of a first conductive type on a semiconductor substrate of the first conductive type, said epitaxial layer having a protrusion formed on a surface thereof;
   (b) forming a well region of a second conductive type on the surface of said epitaxial layer at each side of said protrusion;
   (c) selectively forming a source region of the first conductive type in a surface of said well region;
   (d) forming a gate insulating film so as to cover at least said protrusion and the surface of said well region; and
   (e) forming a gate electrode on a part of said gate insulating film corresponding to said protrusion,
   wherein in said step (d), said gate insulating film is formed such that a film formed in a region thereof corresponding to an upper surface of said protrusion is thicker than a film formed on said well region thereof,
   an upper region of said protrusion of said epitaxial layer has a lower impurity concentration than a lower region of said protrusion of said epitaxial layer, and
   a boundary between said upper region and said lower region of said protrusion extends from one side of said protrusion to the other side of said protrusion at a position below the surface of said well region and above a bottom surface of said source region.

7. The method according to claim 6 further comprising forming the well region with a depth that is deeper than a depth of a boundary between said upper region and said lower region of said epitaxial layer.

8. The method according to claim 6, further comprising etching, using a mask, down to a depth that is shallower than a depth of a boundary between said upper region and said lower region of said epitaxial layer.

* * * * *